United States Patent
Do et al.

(10) Patent No.: US 9,142,530 B2
(45) Date of Patent: Sep. 22, 2015

(54) CORELESS INTEGRATED CIRCUIT PACKAGING SYSTEM AND METHOD OF MANUFACTURE THEREOF

(71) Applicants: Byung Tai Do, Singapore (SG); Arnel Senosa Trasporto, Singapore (SG); Sung Soo Kim, Seoul (KR); Asri Yusof, Singapore (SG); In Sang Yoon, Seoul (KR)

(72) Inventors: Byung Tai Do, Singapore (SG); Arnel Senosa Trasporto, Singapore (SG); Sung Soo Kim, Seoul (KR); Asri Yusof, Singapore (SG); In Sang Yoon, Seoul (KR)

(73) Assignee: STATS ChipPAC Ltd., Singapore (SG)

(*) Notice: Subject to any disclaimer, the term of this patent is extended or adjusted under 35 U.S.C. 154(b) by 0 days.

(21) Appl. No.: 14/214,765

(22) Filed: Mar. 15, 2014

(65) Prior Publication Data
US 2014/0284791 A1 Sep. 25, 2014

Related U.S. Application Data

(60) Provisional application No. 61/804,158, filed on Mar. 21, 2013.

(51) Int. Cl.
*H01L 23/29* (2006.01)
*H01L 23/00* (2006.01)
(Continued)

(52) U.S. Cl.
CPC .............. *H01L 24/81* (2013.01); *H01L 21/486* (2013.01); *H01L 21/4846* (2013.01); *H01L 21/561* (2013.01); *H01L 21/683* (2013.01); *H01L 21/6835* (2013.01); *H01L 23/3121* (2013.01); *H01L 23/3128* (2013.01); *H01L 23/3142* (2013.01); *H01L 23/49816* (2013.01); *H01L 23/49827* (2013.01); *H01L 24/92* (2013.01); *H01L 24/97* (2013.01); *H01L 25/0657* (2013.01); *H01L 24/13* (2013.01); *H01L 24/16* (2013.01); *H01L 24/27* (2013.01); *H01L 24/32* (2013.01); *H01L 24/48* (2013.01); *H01L 24/83* (2013.01); *H01L 24/85* (2013.01); *H01L 2221/68345* (2013.01); *H01L 2221/68381* (2013.01); *H01L 2224/131* (2013.01); *H01L 2224/16227* (2013.01); *H01L 2224/2732* (2013.01); *H01L 2224/27334* (2013.01); *H01L 2224/32145* (2013.01); *H01L 2224/32225* (2013.01); *H01L 2224/48227* (2013.01); *H01L 2224/73253* (2013.01); *H01L 2224/73265* (2013.01); *H01L 2224/81411* (2013.01); *H01L 2224/81444* (2013.01);
(Continued)

(58) Field of Classification Search
None
See application file for complete search history.

(56) References Cited

U.S. PATENT DOCUMENTS

5,901,041 A * 5/1999 Davies et al. .................. 361/704
2003/0017647 A1 * 1/2003 Kwon et al. .................. 438/109
(Continued)

*Primary Examiner* — Reema Patel
(74) *Attorney, Agent, or Firm* — Ishimaru & Associates LLP (57) ABSTRACT

A system and method for manufacturing an integrated circuit packaging system includes: forming a base substrate including: providing a sacrificial carrier: mounting a metallic sheet on the sacrificial carrier, applying a top trace to the metallic sheet, forming a conductive stud on the top trace, forming a base encapsulation over the metallic sheet, the top trace, and the conductive stud, the top trace exposed from a top surface of the base encapsulation, and removing the sacrificial carrier and the metallic sheet; mounting an integrated circuit device on the base substrate; and encapsulating the integrated circuit device and the base substrate with a top encapsulation.

5 Claims, 7 Drawing Sheets

(51) Int. Cl.
*H01L 23/498* (2006.01)
*H01L 21/48* (2006.01)
*H01L 21/56* (2006.01)
*H01L 21/683* (2006.01)
*H01L 25/065* (2006.01)
*H01L 23/31* (2006.01)

(52) U.S. Cl.
CPC ............. *H01L 2224/81447* (2013.01); *H01L 2224/81455* (2013.01); *H01L 2224/81464* (2013.01); *H01L 2224/8385* (2013.01); *H01L 2224/85444* (2013.01); *H01L 2224/9202* (2013.01); *H01L 2224/97* (2013.01); *H01L 2225/0651* (2013.01); *H01L 2225/06517* (2013.01); *H01L 2225/06558* (2013.01); *H01L 2924/15311* (2013.01)

(56) References Cited

U.S. PATENT DOCUMENTS

| | | |
|---|---|---|
| 2012/0058604 A1 | 3/2012 | Chew et al. |
| 2013/0020710 A1 | 1/2013 | Chew et al. |
| 2013/0072012 A1* | 3/2013 | Tseng .......................... 438/613 |

* cited by examiner

CORELESS INTEGRATED CIRCUIT PACKAGING SYSTEM AND METHOD OF MANUFACTURE THEREOF

CROSS-REFERENCE TO RELATED APPLICATION(S)

This application claims the benefit of U.S. Provisional Patent Application Ser. No. 61/804,158 filed Mar. 21, 2013, and the subject matter thereof is incorporated herein by reference thereto.

TECHNICAL FIELD

The present invention relates generally to an integrated circuit packaging system, and more particularly to a coreless integrated circuit packaging system.

BACKGROUND ART

The integrated circuit package is the building block used in a high performance electronic system to provide applications for usage in products such as automotive vehicles, pocket personal computers, cell phone, intelligent portable military devices, aeronautical spacecraft payloads, and a vast line of other similar products that require small compact electronics supporting many complex functions.

A small product, such as a cell phone, can contain many integrated circuit packages, each having different sizes and shapes. Each of the integrated circuit packages within a device such as cell phone can contain large amounts of complex circuitry. The circuitry within each of the integrated circuit packages work and communicate with other circuitry of other integrated circuit packages using electrical connections.

Products must compete in world markets and attract many consumers or buyers in order to be successful. It is very important for products to continue to improve in features, performance, and reliability while reducing product costs, product size, and to be available quickly for purchase by the consumers or buyers.

The amount of circuitry and the amount of electrical connections inside a product are key to improving the features, performance, and reliability of any product. Furthermore, the ways the circuitry and electrical connections are implemented can determine the packaging size, packaging methods, and the individual packaging designs. Attempts have failed to provide a complete solution addressing simplified manufacturing processing, smaller dimensions, lower costs due to design flexibility, increased functionality, leveragability, and increased IO connectivity capabilities.

Thus, a need still remains for an integrated circuit system improved yield, thermal cooling, low profile, improved manufacturing, and improved reliability. In view of the ever-increasing commercial competitive pressures, along with growing consumer expectations and the diminishing opportunities for meaningful product differentiation in the marketplace, it is increasingly critical that answers be found to these problems. In view of the ever-increasing commercial competitive pressures, along with growing consumer expectations and the diminishing opportunities for meaningful product differentiation in the marketplace, it is critical that answers be found for these problems.

Additionally, the need to reduce costs, improve efficiencies and performance, and meet competitive pressures adds an even greater urgency to the critical necessity for finding answers to these problems. Solutions to these problems have been long sought but prior developments have not taught or suggested any solutions and, thus, solutions to these problems have long eluded those skilled in the art.

DISCLOSURE OF THE INVENTION

The present invention provides a method for manufacturing an integrated circuit packaging system that includes: forming a base substrate including: providing a sacrificial carrier, mounting a metallic sheet on the sacrificial carrier, applying a top trace to the metallic sheet, forming a conductive stud on the top trace, forming a base encapsulation over the metallic sheet, the top trace, and the conductive stud, the top trace exposed from a top surface of the base encapsulation, and removing the sacrificial carrier and the metallic sheet; mounting an integrated circuit device on the base substrate; and encapsulating the integrated circuit device and the base substrate with a top encapsulation.

The present invention provides an integrated circuit packaging system including: a base substrate, the base substrate includes: a base encapsulation, a top trace embedded in the base encapsulation, the top trace coplanar with a top surface of the base encapsulation, and a conductive stud on the top trace, the conductive stud embedded in the base encapsulation, the conductive stud coplanar with the top trace; an integrated circuit device on the base substrate; and a top encapsulation encapsulating the base substrate and the integrated circuit device.

Certain embodiments of the invention have other steps or elements in addition to or in place of those mentioned above. The steps or element will become apparent to those skilled in the art from a reading of the following detailed description when taken with reference to the accompanying drawings.

BEST MODE FOR CARRYING OUT THE INVENTION

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

Where multiple embodiments are disclosed and described having some features in common, for clarity and ease of illustration, description, and comprehension thereof, similar and like features one to another will ordinarily be described similarly.

For expository purposes, the term "horizontal" as used herein is defined as a plane parallel to the plane or surface of the semiconductor package, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures. The term "on" means that there is direct contact between elements.

The term "processing" as used herein includes a further process step, deposition of material or photoresist, patterning, exposure, development, etching, cleaning, and/or removal of the material or photoresist as required in forming a described structure.

Embodiments of the present invention have a sacrificial carrier either organic or metallic sheet or combination of both, which acts as a bottom side package protection. The leadfinger or trace material on top of carrier can be a standard Ni Pd Au or equivalent with studs. The plated diameter under stud is smaller than stud diameter giving more space for the leadfinger or trace. The exposed or unplated area of stud may or may not have partial etch.

The stud can be Cu, Cu alloy or other highly conductive metal. The lead finger or trace can have optional selective plating on bond fingers for wirebond type version. For flip chip type, the lead finger or trace can be of copper, copper alloy, tin, tin alloy or other highly conductive material. Copper on organic solder ability preserve (OSP) or with or solder-on-pad (SOP) is optional. Laminate or screen print option can be a simplified process substitute and can accommodate LGA version with nickel-palladium-gold or equivalent plating on the exposed stud.

For a multiple layer option or redistribution layer creation option, via creation can be mechanical, laser or lithography with a dielectric isolation material between the multiple layers. There can be an optional layer on the metal or leadfinger or trace side. Bottom side protection can be with solder resist, mold compound, or other encapsulation material.

Embodiments of the invention can be in a hybrid configuration with both wire interconnect and flip chip semiconductor devices. A rail-less or carrier-less method can be used for warpage control.

Figure 1:
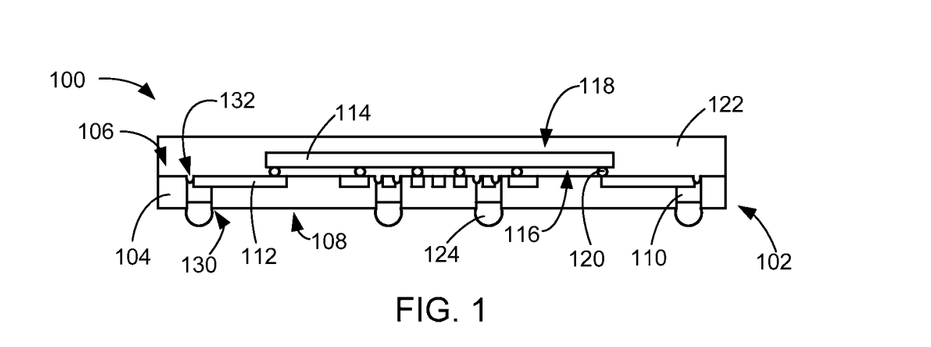
FIG. 1 is a cross-sectional view of an integrated circuit packaging system along a line 1-1 of FIG. 2 in a first embodiment of the present invention.
Figure 2:
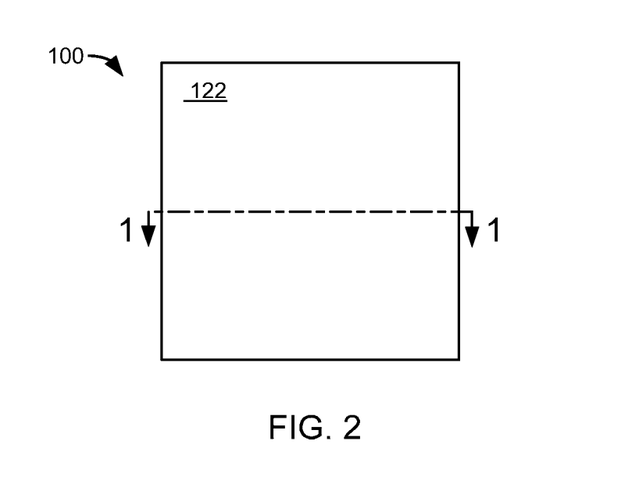
FIG. 2 is a top view of the integrated circuit packaging system.

Referring now to FIG. 1, therein is shown a cross-sectional view of an integrated circuit packaging system 100 along a line 1-1 of FIG. 2 in a first embodiment of the present invention. The integrated circuit packaging system 100 can include a semiconductor package as an example. The cross-sectional view includes a flip chip example of the present invention including both solder ball and land grid array (LGA) package interconnects, although only the solder ball package interconnects are shown.

The integrated circuit packaging system 100 can include a base substrate 102. The base substrate 102 can provide support for structures of the integrated circuit packaging system 100. The base substrate 102 can include a top surface 106 and a bottom surface 108 opposite to the top surface 106.

The base substrate 102 can include a coreless substrate without a semiconductor core or dielectric film core. For example, the base substrate 102 includes a base encapsulation 104 as a support platform. The base encapsulation 104 can include materials for housing or supporting the structures within the base substrate 102. For example, the base encapsulation 104 can include an encapsulating film, epoxy mold compound (EMC), wire-in-firm material, encapsulation, lamination, screen print material, or equivalent material.

The base substrate 102 can include a conductive stud 110. The conductive stud 110 or recessed stud can provide an electrical connection from the top surface 106 to the bottom surface 108. The conductive stud 110 can include a via, a pillar, and a post, as examples. The conductive stud 110 is embedded in the base substrate 102. The base substrate 102 isolates the conductive stud 110 from another of the conductive stud 110.

The amount of recess for the conductive stud 110 can be dependent on the thickness or vertical height of the base encapsulation 104. For example, the recess height can be 7-17 μm. The diameter for the conductive stud 110 can be 250-300 μm.

The conductive stud 110 can include a bottom recess 130 and a top recess 132. The bottom recess 130 reduces the height of solder balls or other interconnects that are mounted on the conductive stud 110 at the bottom surface 108. The top recess 132 can provide mold locking benefits with encapsulations formed on the base substrate 102.

The base substrate 102 can include a top trace 112, which is defined as a conductive structure for providing electrical signal and power redistribution. The top trace 112 can include a redistribution layer, routable traces, and embedded wires as examples. The top trace 112 is embedded within the base encapsulation 104 and is exposed from the top surface 106 of the base substrate 102.

A top side of the top trace 112 can be coplanar with the top surface 106 of the base substrate 102, which provides structural support and protection for the top trace 112. The top trace 112 can include Nickel (Ni), Palladium (Pd), Gold (Au), or equivalent conductive metal or alloy. The integrated circuit packaging system 100 can include multiple instances of the top trace 112.

The integrated circuit packaging system 100 can include an integrated circuit device 114 mounted on the top trace 112 and the base substrate 102. The integrated circuit device 114 is defined as a semiconductor device having one or more integrated transistors for implementing active circuitry.

For example, the integrated circuit device 114 can include interconnects, passive devices, or a combination thereof. For example, a flip-chip or a wafer scale chip can be representative of the integrated circuit device 114, as the current example shows the integrated circuit device 114 in a flip-chip configuration. However, the integrated circuit device 114 can also be in a wire-bonded configuration, or a hybrid or combination of stacked devices.

The integrated circuit device 114 can include an interconnect side 116 for attachment to the top trace 112 of the base substrate 102. The interconnect side 116 of the integrated circuit device 114 can include contacts, fabricated thereon. The integrated circuit device 114 can also include an inactive side 118, which is a side opposite the interconnect side 116.

The integrated circuit packaging system 100 can include a chip interconnect 120. The chip interconnect 120 provides an electrical connection and can include a solder ball, a bond wire, or solder as examples. The chip interconnect 120 provides electrical connectivity between the integrated circuit device 114 and the base substrate 102. The chip interconnect 120 can be attached to the interconnect side 116 of the integrated circuit device 114.

The integrated circuit packaging system 100 can include a top encapsulation 122, which is defined as a cover for hermetically sealing a semiconductor device and for providing mechanical and environmental protection. The top encapsulation 122 can be formed covering or over the integrated circuit device 114, the chip interconnect 120, the top trace 112, and the conductive stud 110. The top encapsulation 122 can fill in the top recess 132, which provides a mold lock between the top encapsulation 122 and the base substrate 102.

The integrated circuit packaging system 100 can include a system interconnect 124 mounted to the conductive stud 110 at the bottom surface 108. The system interconnect 124 provides an electrical connection and can include a solder ball, a solder bump, or a solder joint as examples. The system interconnect 124 is in direct contact with the conductive stud 110 and is in direct contact with the base encapsulation 104 with a portion of the system interconnect 124 embedded within the base encapsulation 104. The system interconnect 124 provides electrical connectivity between the top trace 112 and an external components or systems (not shown).

It has been discovered that the configuration and composition of the base substrate 102 with the base encapsulation 104 simplifies construction and reduces material cost over substrates comprised of single semi-conductive materials. For example, the use of laminate, epoxy, or screen printing materials for the base encapsulation 104 can simplify construction and provide protection for the top trace 112 and the conductive stud 110. The base substrate 102 with the base encapsulation 104 and embedded traces and studs removes the need for time consuming semiconductor printing methods.

It has been found that the conductive stud 110 having the bottom recess 130 reduces overall package height, resulting in a thinner and slimmer package. It has been discovered that the conductive stud 110 having the top recess 132 provides a mold locking feature with the top encapsulation 122. The mold locking feature prevents peal way, separation, and warpage of the top encapsulation 122 with the base substrate 102.

It has been found that the base substrate 102 with the base encapsulation 104, the top trace 112, and the conductive stud 110 provides a conductive support structure without destructive methods such as drilling and laser ablation. The conductive structures are arranged before encapsulation, which removes the need for drilling in subsequent process steps. Construction materials are preserved and cleaning steps are removed, which reduces overall manufacturing steps and improves production yield.

It has been discovered that the base substrate 102 having the conductive stud 110 embedded within the base encapsulation 104 provides versatility for a ball-grid array (BGA) configuration as well as a land grid array (LGA) configuration with little modification. The integrated circuit packaging system 100 provides a universal package that is compatible with both LGA and BGA configurations.

Referring now to FIG. 2, therein is shown a top view of the integrated circuit packaging system 100. A top side of the top encapsulation 122 is shown.

Figure 3:
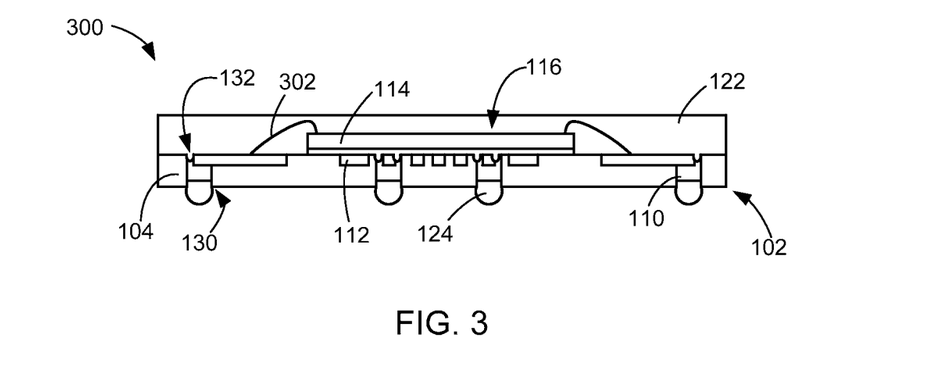
FIG. 3 is a cross-sectional view of an integrated circuit packaging system along a line 1-1 of FIG. 2 in a second embodiment of the present invention.

Referring now to FIG. 3, therein is shown a cross-sectional view of an integrated circuit packaging system 300 along a line 1-1 of FIG. 2 in a second embodiment of the present invention. The cross-sectional view includes a wire bond embodiment of the present invention. The embodiment can have both solder ball and LGA package interconnects although only the solder ball package interconnects are shown.

The integrated circuit packaging system 300 is similar to the integrated circuit packaging system 100 of FIG. 1 except the integrated circuit packaging system 300 does not include the chip interconnect 120 of FIG. 1. The integrated circuit packaging system 300 can include the base substrate 102, the conductive stud 110, the top trace 112, the top encapsulation 122, and the system interconnect 124.

The integrated circuit device 114 is shown in a wire-bond configuration although it is understood that the integrated circuit device 114 can be in a flip chip configuration as shown in FIG. 1. The interconnect side 116 of the integrated circuit device 114 is facing in a direction opposite to the base substrate 102. The integrated circuit packaging system 300 can include a wire interconnect 302.

The wire interconnect 302 can provide an electrical connection for the devices mounted on the base substrate 102. For example, the wire interconnect 302 can be attached to the integrated circuit device 114 for providing an electrical connection between the integrated circuit device 114 and the top trace 112. The top trace 112 can include selective plating at bond fingers for attachment to the wire interconnect 302.

It has been discovered that the configuration and composition of the base substrate 102 with the base encapsulation 104 simplifies construction and reduces material cost over substrates comprised of single semi-conductive materials. For example, the use of laminate, epoxy, or screen printing materials for the base encapsulation 104 can simplify construction and provide protection for the top trace 112 and the conductive stud 110. The base substrate 102 with the base encapsulation 104 and embedded traces and studs removes the need for time consuming semiconductor printing methods.

It has been found that the conductive stud 110 having the bottom recess 130 reduces overall package height, resulting in a thinner and slimmer package. It has been discovered that the conductive stud 110 having the top recess 132 provides a mold locking feature with the top encapsulation 122. The mold locking feature prevents peal way, separation, and warpage of the top encapsulation 122 with the base substrate 102.

It has been found that the base substrate 102 with the base encapsulation 104, the top trace 112, and the conductive stud 110 provides a conductive support structure without destructive methods such as drilling and laser ablation. The conductive structures are arranged before encapsulation, which removes the need for drilling in subsequent process steps. Construction materials are preserved and cleaning steps are removed, which reduces overall manufacturing steps and improves production yield.

It has been discovered that the base substrate 102 having the conductive stud 110 embedded within the base encapsulation 104 provides versatility for a ball-grid array (BGA) configuration as well as a land grid array (LGA) configuration with little modification. The integrated circuit packaging system 100 provides a universal package that is compatible with both LGA and BGA configurations.

Figure 4:
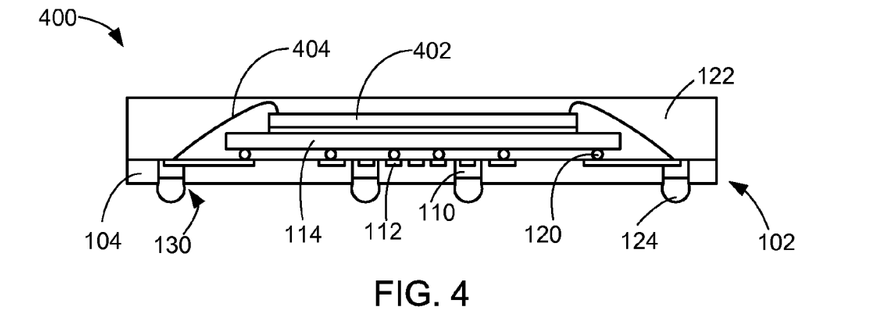
FIG. 4 is a cross-sectional view of an integrated circuit packaging system along a line 1-1 of FIG. 2 in a third embodiment of the present invention.

Referring now to FIG. 4, therein is shown a cross-sectional view of an integrated circuit packaging system 400 along a line 1-1 of FIG. 2 in a third embodiment of the present invention. The cross-sectional view includes both a flip chip and wire bond configuration or hybrid configuration of the present invention. The embodiment can have both solder ball and land grid array (LGA) package interconnects although only the solder ball package interconnects are shown.

The integrated circuit packaging system 400 can include the components of FIG. 1 including the base substrate 102, the conductive stud 110, the top trace 112, the top encapsulation 122, the integrated circuit device 114, the chip interconnect 120, and the system interconnect 124.

The integrated circuit packaging system 400 is similar to the integrated circuit packaging system 100 of FIG. 1 except the integrated circuit packaging system 400 includes a stacked device 402 mounted on top of the integrated circuit device 114. The stacked device 402 is defined as a semiconductor device having one or more integrated transistors for implementing active circuitry.

The stacked device 402 is shown in a wire-bond configuration although it is understood that the integrated circuit device 114 can be in a flip chip configuration. The stacked device 402 is attached to the integrated circuit device 114 with an adhesive. The stacked device 402 includes lateral dimensions or a width that are smaller than the lateral dimensions of the integrated circuit device 114, which allows the stacked device 402 to fit on top of the integrated circuit device 114.

The integrated circuit packaging system 400 includes a stacked interconnect 404, which provides an electrical connection for the devices mounted on the base substrate 102. The stacked interconnect 404 can include a wire bond for attaching the stacked device 402 to the base substrate 102. The top trace 112 can include selective plating at bond fingers for attachment to the stacked interconnect 404.

It has been discovered that the configuration and composition of the base substrate 102 with the base encapsulation 104 simplifies construction and reduces material cost over substrates comprised of single semi-conductive materials. For example, the use of laminate, epoxy, or screen printing materials for the base encapsulation 104 can simplify construction and provide protection for the top trace 112 and the conductive stud 110. The base substrate 102 with the base encapsulation 104 and embedded traces and studs removes the need for time consuming semiconductor printing methods.

It has been found that the conductive stud 110 having the bottom recess 130 reduces overall package height, resulting in a thinner and slimmer package. It has been discovered that the base substrate 102 with the base encapsulation 104, the top trace 112, and the conductive stud 110 provides a conductive support structure without destructive methods such as drilling and laser ablation. The conductive structures are arranged before encapsulation, which removes the need for drilling in subsequent process steps. Construction materials are preserved and cleaning steps are removed, which reduces overall manufacturing steps and improves production yield.

It has been discovered that the base substrate 102 having the conductive stud 110 embedded within the base encapsulation 104 provides versatility for a ball-grid array (BGA) configuration as well as a land grid array (LGA) configuration with little modification. The integrated circuit packaging system 100 provides a universal package that is compatible with both LGA and BGA configurations.

Figure 5:
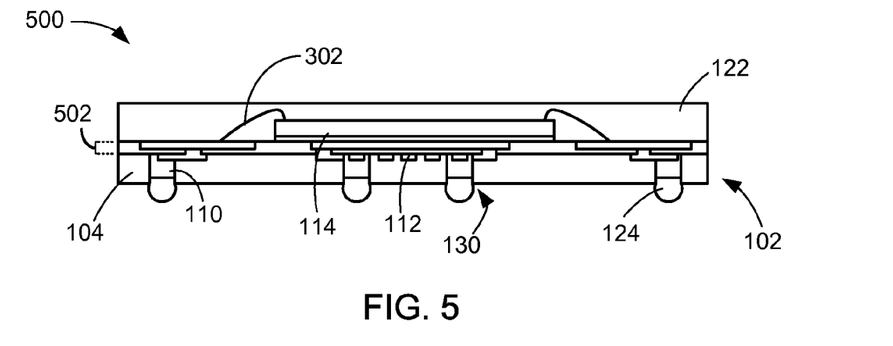
FIG. 5 is a cross-sectional view of an integrated circuit packaging system along a line 1-1 of FIG. 2 in a fourth embodiment of the present invention.

Referring now to FIG. 5, therein is shown a cross-sectional view of an integrated circuit packaging system 500 along a line 1-1 of FIG. 2 in a fourth embodiment of the present invention. The cross-sectional view includes a wire bond embodiment of the present invention. The embodiment can have both solder ball and land grid array (LGA) package interconnects although only the solder ball package interconnects are shown.

The integrated circuit packaging system 500 is similar to the integrated circuit packaging system 300 of FIG. 3 except the integrated circuit packaging system 300 includes a redistribution layer 502. The integrated circuit packaging system 300 can include the base substrate 102, the conductive stud 110, the top trace 112, the top encapsulation 122 of FIG. 1, and the system interconnect 124 of FIG. 1.

The integrated circuit device 114 is shown in a wire-bond configuration although it is understood that the integrated circuit device 114 can be in a flip chip configuration as shown in FIG. 1. The integrated circuit packaging system 300 can include the wire interconnect 302.

The wire interconnect 302 can provide an electrical connection for the devices mounted on the base substrate 102. For example, the wire interconnect 302 can be attached to the integrated circuit device 114 for providing an electrical connection between the integrated circuit device 114 and the top trace 112. The top trace 112 can include selective plating at the bond fingers for attachment to the wire interconnect 302.

The redistribution layer 502 or multi layer can include traces surround by dielectric material. The redistribution layer 502 can be mounted directly on the base substrate 102 with the top trace 112 embedded within the dielectric material. Traces from the redistribution layer 502 can be directly attached to the top trace 112 and can be embedded within the base encapsulation 104. The conductive stud 110 can be in direct contact with the traces of the redistribution layer 502 and the wire interconnect 302 can be attached to the top trace 112.

It has been discovered that the configuration and composition of the base substrate 102 with the base encapsulation 104 simplifies construction and reduces material cost over substrates comprised of single semi-conductive materials. For example, the use of laminate, epoxy, or screen printing materials for the base encapsulation 104 can simplify construction and provide protection for the top trace 112 and the conductive stud 110. The base substrate 102 with the base encapsulation 104 and embedded traces and studs removes the need for time consuming semiconductor printing methods. It has been found that the conductive stud 110 having the bottom recess 130 reduces overall package height, resulting in a thinner and slimmer package.

It has unexpectedly found that the base substrate 102 with the base encapsulation 104, the top trace 112, and the conductive stud 110 provides a conductive support structure without destructive methods such as drilling and laser ablation. The conductive structures are arranged before encapsulation, which removes the need for drilling in subsequent process steps. Construction materials are preserved and cleaning steps are removed, which reduces overall manufacturing steps and improves production yield.

It has been discovered that the base substrate 102 having the conductive stud 110 embedded within the base encapsulation 104 provides versatility for a ball-grid array (BGA) configuration as well as a land grid array (LGA) configuration with little modification. The integrated circuit packaging system 100 provides a universal package that is compatible with both LGA and BGA configurations.

Figure 6:
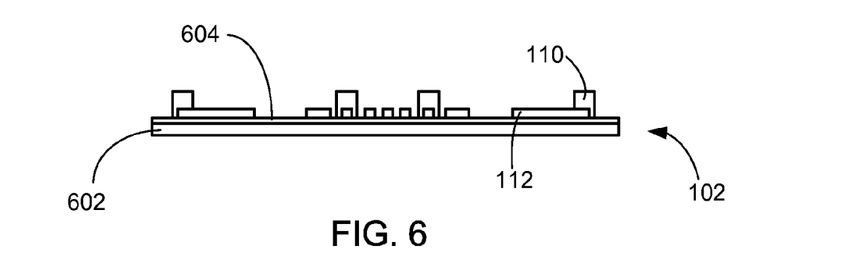
FIG. 6 is a portion of the base substrate of FIG. 1 in a deposition phase of manufacture.

Referring now to FIG. 6, therein is shown a portion of the base substrate 102 of FIG. 1 in a deposition phase of manufacture. A sacrificial carrier 602 and a metallic sheet 604 are provided. The sacrificial carrier 602 can include a metal carrier, SUS plate, FR4 plate, or polymer reinforced plate as examples.

The metallic sheet 604 can include a conductive material such as copper. The metallic sheet 604 is provided on top of the sacrificial carrier 602. The metallic sheet 604 provides a platform for mounting conductive structures such as the top trace 112 of FIG. 1 and the conductive stud 110 of FIG. 1.

The metallic sheet 604 can also include organic material. The metallic sheet 604 with organic material can act as protection for the top trace 112 and the conductive stud 110 deposited thereon. The organic material can be composed of carbon and provide rigidity and structural support for the components mounted thereon.

The top trace 112 can be formed directly on the metallic sheet 604. The conductive stud 110 can be formed on a portion of the top trace 112 and the metallic sheet 604. The conductive stud 110 can be composed of the same material as the metallic sheet 604 and of a different material than that of the top trace 112. A surface of the top trace 112 facing the metallic sheet 604 is coplanar with a surface of the conductive stud 110 facing the metallic sheet 604.

It has been discovered that the metallic sheet 604 and the conductive stud 110, being composed of the same conductive material, reduces manufacturing steps by allowing the creation of the top recess 132 of FIG. 1 at the same time. For example, as the metallic sheet 604 is removed to expose the top trace 112, a single process can also create the top recess 132 instead of a using a separate etching process for creating the top recess 132.

Figure 7:
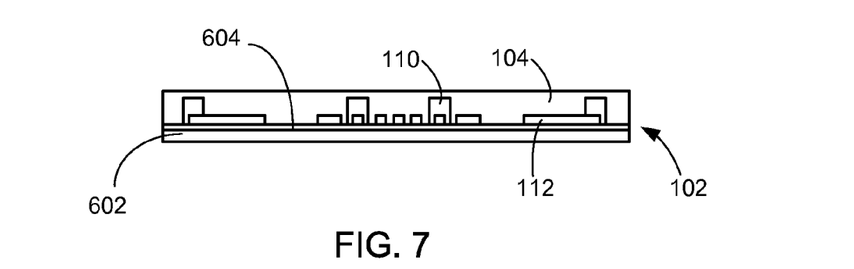
FIG. 7 is the structures of FIG. 6 in a base-encapsulation phase of manufacture.

Referring now to FIG. 7, therein is shown the structures of FIG. 6 in a base-encapsulation phase of manufacture. The base substrate 102 of FIG. 1 is formed by encapsulating the conductive stud 110, the top trace 112, and the metallic sheet 604 with the base encapsulation 104. The base substrate 102 can be formed using an epoxy molding compound (EMC), screen printing material, film, lamentation, or equivalent encapsulation material. A surface of the conductive stud 110 facing opposite from the metallic sheet 604 can be covered by the base encapsulation 104.

Figure 8:
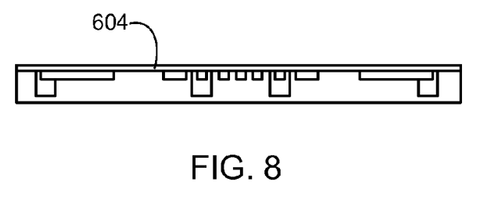
FIG. 8 is the structures of FIG. 7 in a carrier removal phase of manufacture.

Referring now to FIG. 8, therein is shown the structures of FIG. 7 in a carrier removal phase of manufacture. The sacrificial carrier 602 of FIG. 7 is removed exposing the metallic sheet 604.

Figure 9:
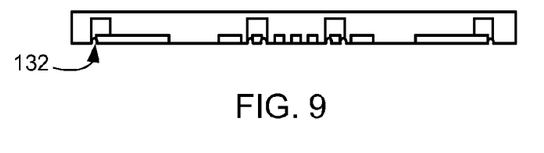
FIG. 9 is the structures of FIG. 8 in an etching phase of manufacture.

Referring now to FIG. 9, therein is shown the structures of FIG. 8 in an etching phase of manufacture. The metallic sheet 604 of FIG. 8 is removed. During this phase, the top recess 132 can also be created in the same etching process. Further, the top recess 132 can be further processed to the specific depth and shape required by the specifications of the package system.

The amount of recess for the top recess 132 can be dependent on the thickness or vertical height of the base encapsulation 104. For example, the recess height or depth for the top recess 132 can be 10-25 µm.

Figure 10:
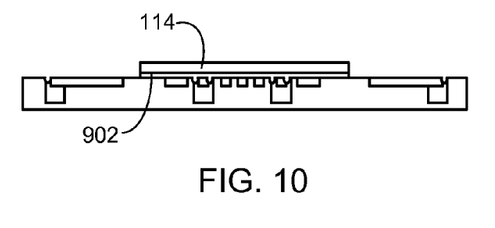
FIG. 10 is the structures of FIG. 9 in a die-attach phase of manufacture.

Referring now to FIG. 10, therein is shown the structures of FIG. 9 in a die-attach phase of manufacture. The integrated circuit device 114 of FIG. 3 can be attached to the base substrate 102. An adhesive 902, such as an adhesive tape or adhesive paste, can be used to attach the integrated circuit device 114 to the base substrate 102.

Figure 11:
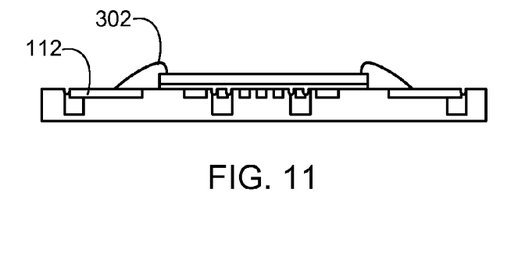
FIG. 11 is the structures of FIG. 10 in an interconnect-attaching phase of manufacture.

Referring now to FIG. 11, therein is shown the structures of FIG. 10 in an interconnect-attaching phase of manufacture. The wire interconnect 302 of FIG. 3 can be used to provide an electrical connection from the interconnect side 116 to the top trace 112. The top trace 112 can be selectively plated to form bond fingers for attachment to the wire interconnect 302.

Figure 12:
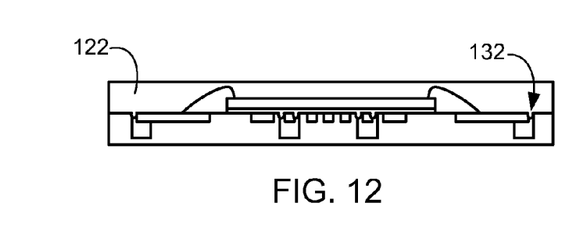
FIG. 12 is the structures of FIG. 11 in a top-encapsulation phase of manufacture.

Referring now to FIG. 12, therein is shown the structures of FIG. 11 in a top-encapsulation phase of manufacture. The top encapsulation 122 is formed over the base substrate 102 of FIG. 3, the conductive stud 110 of FIG. 3, the top trace 112 of FIG. 3, the integrated circuit device 114 of FIG. 3, and the wire interconnect 302 of FIG. 3.

The top encapsulation 122 can be formed using an epoxy molding compound (EMC), film, or equivalent encapsulation material. The top encapsulation 122 can fill in the top recess 132 etched into the conductive stud 110, which is below the top surface of the base substrate 102. It has been discovered that the top encapsulation 122 within the top recess 132 of the conductive stud 110 provides mold locking advantages, which prevents the top encapsulation 122 and the base substrate 102 from pulling apart.

Figure 13:
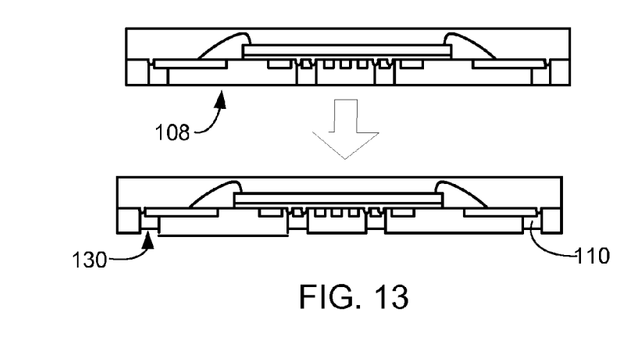
FIG. 13 is the structures of FIG. 11 in a grinding phase of manufacture.

Referring now to FIG. 13, therein is shown the structures of FIG. 11 in a grinding phase of manufacture. The bottom surface 108 of the base substrate 102 of FIG. 3 can be grinded or buffed for height reduction and for exposing the conductive stud 110 from the bottom surface 108 of the base substrate 102. The bottom recess 130 is formed by grinding or buffing. The conductive stud 110 is recessed from the bottom surface 108.

Figure 14:
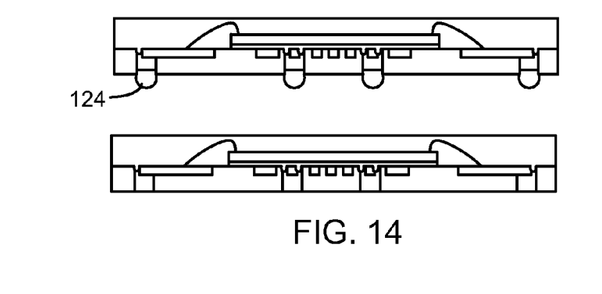
FIG. 14 is the structures of FIG. 13 in a system-interconnect phase of manufacture.

Referring now to FIG. 14, therein is shown the structures of FIG. 13 in a system-interconnect phase of manufacture. The system interconnect 124 can be attached to the conductive stud 110 within the bottom recess 130. Alternatively, the structure of FIG. 13 can be used in a LGA configuration by attaching lands to the conductive stud 110 without the bottom recess 130 of FIG. 3. Lands can be attached to the conductive stud 110 for a LGA configuration.

Figure 15:
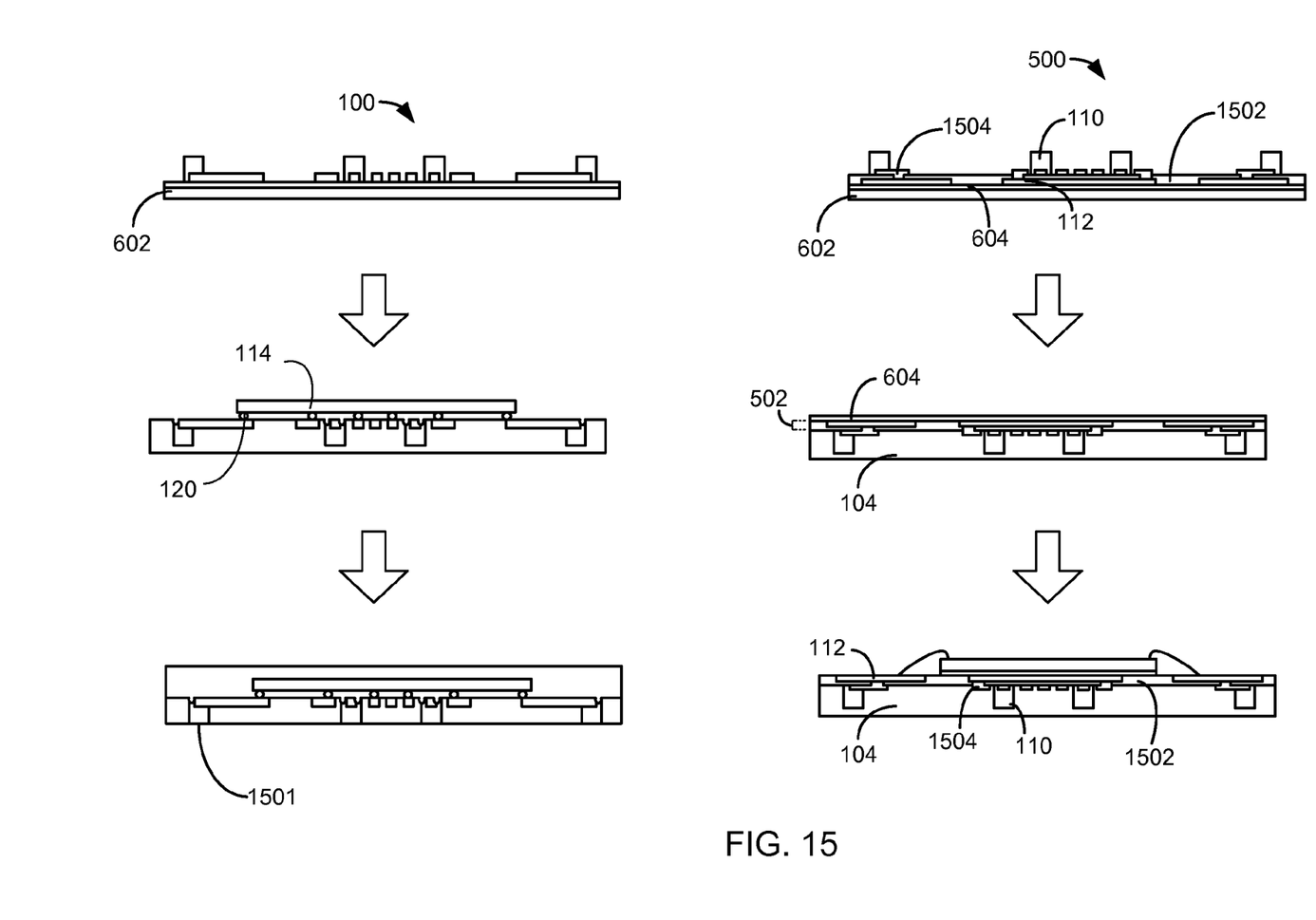
FIG. 15 is examples of alternative manufacturing flows for the integrated circuit packaging system and the integrated circuit packaging system.

Referring now to FIG. 15, therein is shown examples of alternative manufacturing flows for the integrated circuit packaging system 100 and the integrated circuit packaging system 500. The manufacturing flows can include variation on the steps shown in FIGS. 6-14.

For simplicity in explanation, some of the process steps from the manufacturing flow of FIGS. 6-14 are omitted to highlight the variations, although it is understood that the variations can include a combination of the same process steps. The examples can show the sacrificial carrier 602.

In one example, the integrated circuit device 114 of FIG. 1 is shown mounted to the base substrate 102 of FIG. 1. Instead of the wire interconnect 302 of FIG. 3, the chip interconnect 120 is used on the integrated circuit device 114 in a flip-chip configuration. The process steps of encapsulation and grinding can be identical to the steps seen in FIGS. 12-14.

The example can include a land contact surface 1501. The land contact surface 1501 is a bottom surface of the conductive stud 110. The land contact surface 1501 can be used for land attachment in a LGA configuration.

The example also includes a detailed view of the integrated circuit packaging system 500. The redistribution layer 502 can include a dielectric layer 1502 and a bottom trace 1504. The dielectric layer 1502 is formed directly on the top trace 112 and the metallic sheet 604, where a surface of the dielectric layer 1502 is coplanar with the top trace 112 and the metallic sheet 604.

The dielectric layer 1502 can be processed, printed, or patterned for insertion of the bottom trace 1504. The bottom trace 1504, which includes a conductive structure for providing electrical signal and power redistribution, can be formed over the dielectric layer 1502 and directly contact the top trace 112 through holes formed in the dielectric layer 1502. After encapsulation with the base encapsulation 104, the bottom trace 1504 is embedded in the base encapsulation 104 and the top trace 112 is isolated from the base encapsulation 104 by the dielectric layer 1502.

The redistribution layer 502 can also be a multi-layer. The integrated circuit packaging system 500 can also include the stacked device 402 mounted over the integrated circuit device 114. The manufacturing flow for the integrated circuit packaging system 500 can also include lamination or screen printing to form the base encapsulation 104 of the integrated circuit packaging system 500.

It has been unexpectedly found that the dielectric layer 1502 and the bottom trace 1504 can be formed directly on the metallic sheet 604 and the top trace 112, which provides for a simplified manufacturing process and coplanar surfaces. This simplified process eliminates separate manufacturing steps and allows the top trace 112 and the redistribution layer 502 to be formed during the same manufacturing phase.

It has also been found that the redistribution layer 502 can provide more routing options and routing surface area for a package with limited lateral dimensions. The redistribution layer 502 provides for more routing surface area and pathways for multiple dies included within the package or mounted on top of the integrated circuit device 114.

Figure 16:
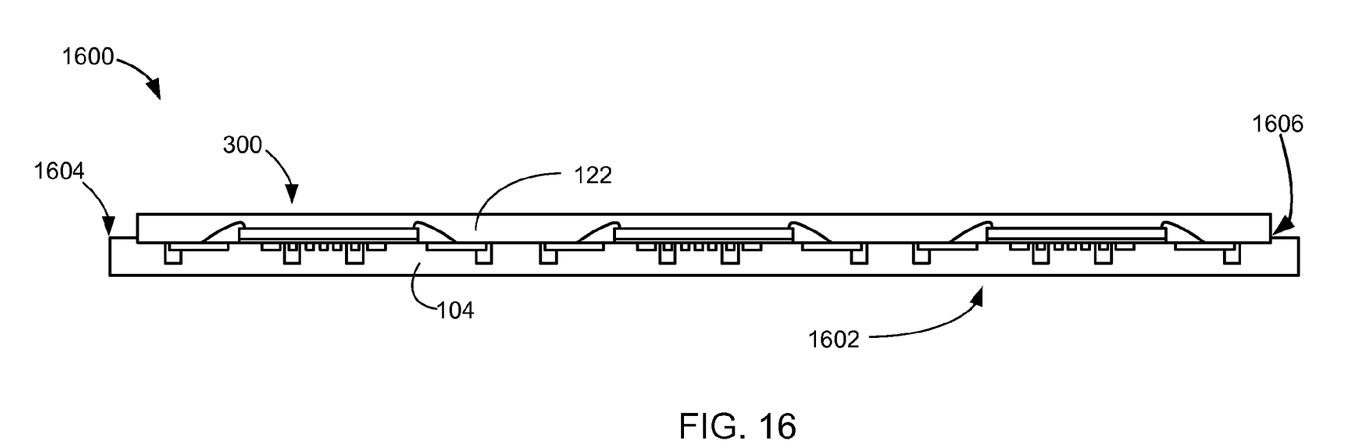
FIG. 16 is a partial view example of an integrated circuit packaging system on a strip or wafer-level scale.

Referring now to FIG. 16, therein is shown a partial view example of an integrated circuit packaging system 1600 on a strip or wafer-level scale. The integrated circuit packaging system 1600 can be similar to the integrated circuit packaging system 300 except that the integrated circuit packaging system 1600 is pre-singulated.

The example includes multiple instances of the integrated circuit packaging system 300 for singulation at a later phase of manufacture. The multiple instances can be formed on a large base carrier. For example, the manufacturing steps from FIGS. 6-14 can be performed on a large strip scale as seen in the example for the integrated circuit packaging system 1600. The integrated circuit packaging system 1600 can include a strip 1602, an overlap rim 1604, and a mold overlap 1606.

The overlap rim 1604 is defined as a projecting edge, collar, or rib for strengthening or supporting the strip 1602 on a magazine. The overlap rim 1604 is attached or extends from to the base encapsulation 104 and can be composed of the same material as the base encapsulation 104.

The overlap rim 1604 extends laterally beyond the lateral dimensions of the top encapsulation 122. The overlap rim 1604 provides structure support and warpage control by providing a gripping point during singulation of the multiple packages. The overlap rim 1604 reduces damage and shock to the structures and components housed within the top encapsulation 122.

It has been found that the overlap rim 1604 can provide a contact point for being held on a magazine for a succeeding process, which allows the strip 1602 to use a rail-less system. The overlap rim 1604 can also provide for rail-less or carrier-less manufacture on a strip level. The overlap rim 1604 provides the benefit of unit level warpage control and saves construction material that would be used for rails.

The mold overlap 1606 is an edge of the top encapsulation 122 that intersects with the base substrate 102. The mold overlap 1606 can be formed by providing a recess in the base encapsulation 104. The top encapsulation 122 is formed on the base encapsulation 104 and a portion of the base encapsulation 104 at the mold overlap surrounds a portion of the lateral sidewalls of the top encapsulation 122. It has been found that the mold overlap 1606 provides mold locking benefits for the package and prevents separation of the top encapsulation 122 and the base encapsulation 104.

Figure 17:
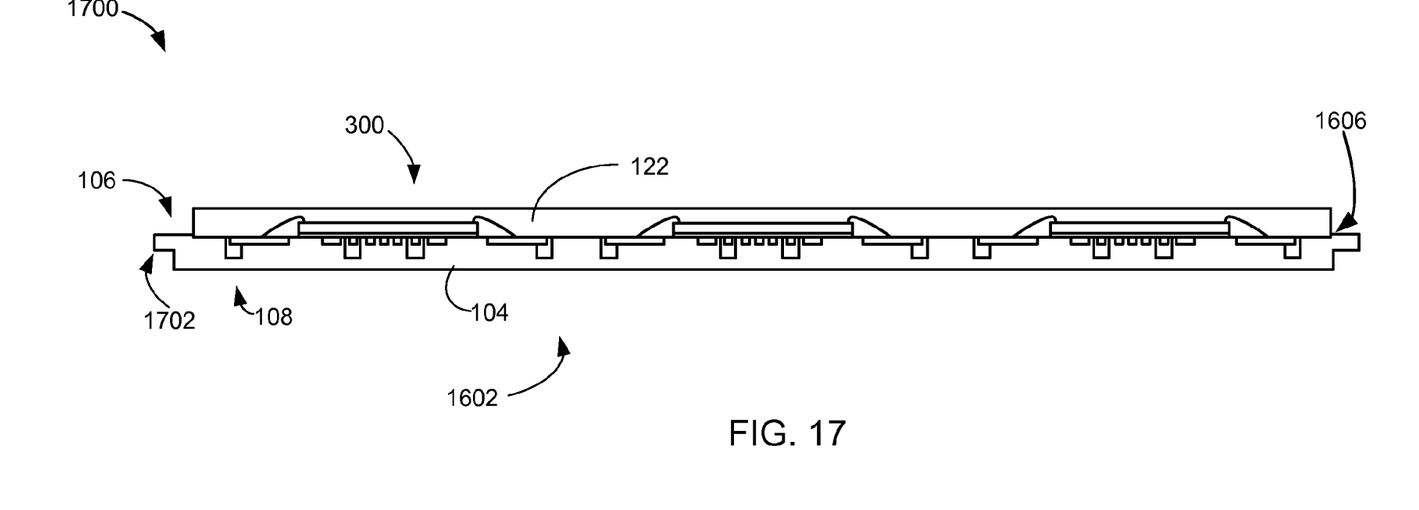
FIG. 17 is a partial view example of an integrated circuit packaging system on a strip or wafer-level scale.

Referring now to FIG. 17, therein is shown a partial view example of an integrated circuit packaging system 1700 on a strip or wafer-level scale. The integrated circuit packaging system 1700 can be similar to the integrated circuit packaging system 1600 except that the integrated circuit packaging system 1700 includes a flange 1702. The integrated circuit packaging system 1700 can include the mold overlap 1606.

The integrated circuit packaging system 300 can include the flange 1702 attached to the base encapsulation 104. The flange 1702 is composed of the same material as the base encapsulation 104 and the flange 1702 extends laterally beyond the top encapsulation 122. The flange 1702 is defined as a projecting rim, collar, or rib for strengthening or supporting the strip 1602 on a magazine.

The flange 1702 is attached or extends from to the base encapsulation 104 and can be composed of the same material as the base encapsulation 104. The flange 1702 extends from the top surface 106 but is undercut at the bottom surface forming a thinner rim than the width of the base encapsulation 104. The flange 1702 provides structure support and warpage control by providing a gripping point during singulation of the multiple packages. The flange 1702 reduces damage and shock to the structures and components housed with the top encapsulation 122.

It has been found that the flange 1702 can provide a contact point for being held on a magazine for a succeeding process, which allows the strip 1602 to use a rail-less system. The flange 1702 can also provide for rail-less or carrier-less manufacture on a strip level. The flange 1702 provides the benefit of unit level warpage control and saves construction material that would be used for rails.

Figure 18:
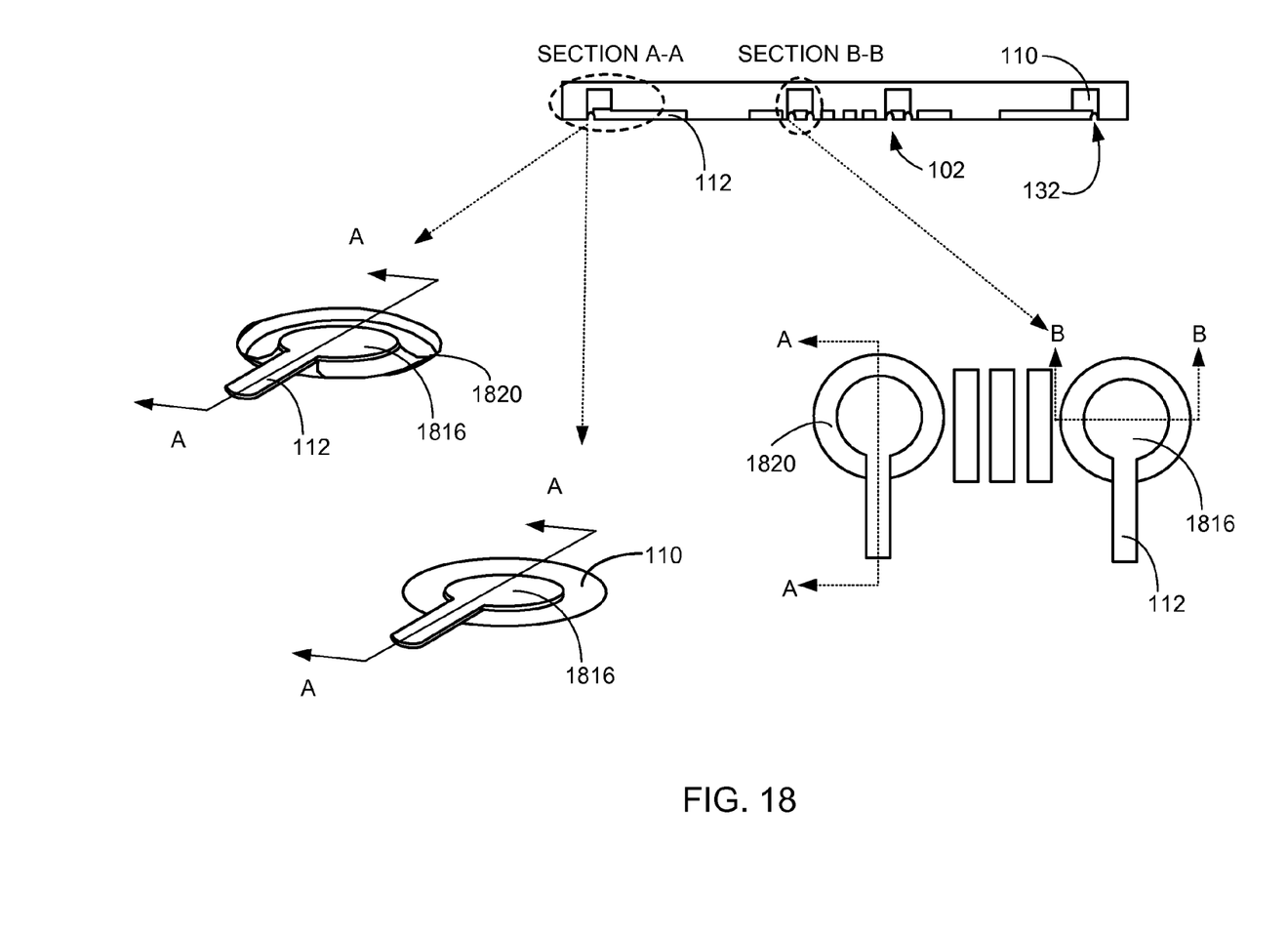
FIG. 18 is a detailed view of the top recess of FIG. 1 of the conductive stud of FIG. 1.

Referring now to FIG. 18, therein is shown a detailed view of the top recess 132 of FIG. 1 of the conductive stud 110 of FIG. 1. The detailed view includes isometric views and top views of the conductive stud 110 and the top trace 112. The isometric view includes a top ball pad 1816, a peripheral groove 1820, the top trace 112, and the conductive stud 110. The detailed views are taken along the lines A-A and B-B from a cross-section view of the base substrate 102.

After the etching of the metallic sheet 604 of FIG. 6, the top ball pad 1816 can be formed from a portion of the top trace 112 on the conductive stud 110. A surface of the conductive stud 110 can surround the top ball pad 1816 and the top ball pad 1816 can be partially embedded in the conductive stud 110.

The surface of the conductive stud 110 surrounding the top ball pad 1816 can be further etched for forming the peripheral groove 1820. The top recess 132 can include the peripheral groove 1820. The peripheral groove 1820 is formed by trenching the area of the conductive stud 110 surrounding the top ball pad 1816. The conductive stud 110 can include the peripheral groove 1820 or the conductive stud 110 can remain un-trenched depending on the manufacturing requirements of the system.

It has been found that the peripheral groove 1820 can provide structure benefits such as adequate terminal diameter and more trace space. Further, the peripheral groove 1820 or the top recess 132 can provide a mold locking mechanism with the top encapsulation 122 of FIG. 1. It has also been discovered that the partial etching of the peripheral groove 1820 prevents undercutting of the top ball pad 1816 during creation of the top ball pad 1816.

Figure 19:
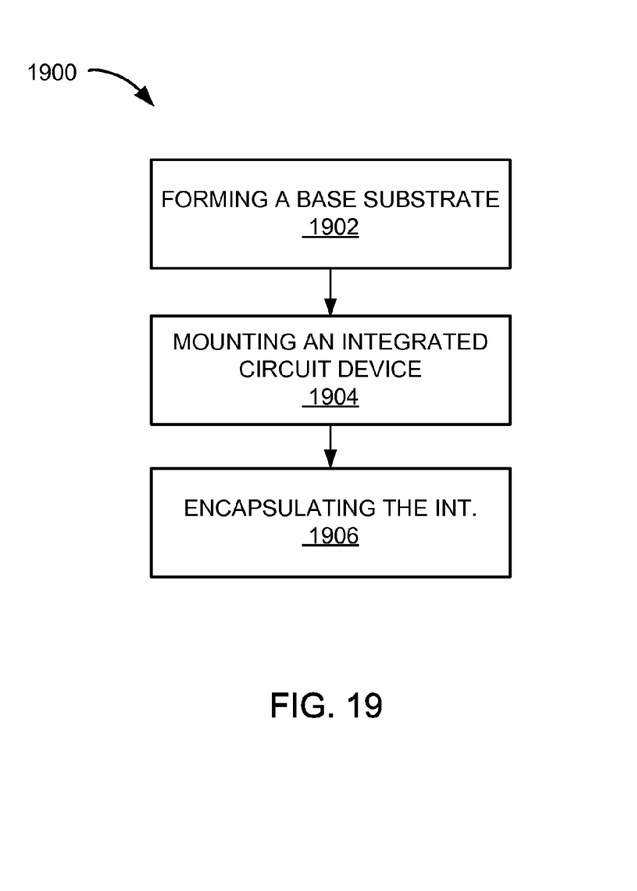
FIG. 19 is a flow chart of a method of manufacture of the integrated circuit packaging system in a further embodiment of the present invention.

Referring now to FIG. 19, therein is shown a flow chart of a method 1900 of manufacture of the integrated circuit packaging system 100 in a further embodiment of the present invention. The method 1900 includes: forming a base substrate in a block 1902, including: providing a sacrificial carrier: mounting a metallic sheet on the sacrificial carrier, applying a top trace to the metallic sheet, forming a conductive stud on the top trace, forming a base encapsulation over the metallic sheet, the top trace, and the conductive stud, the top trace exposed from a top surface of the base encapsulation, and removing the sacrificial carrier and the metallic sheet; mounting an integrated circuit device on the base substrate in a block 1904; and encapsulating the integrated circuit device and the base substrate with a top encapsulation in a block 1906.

The resulting method, process, apparatus, device, product, and/or system is straightforward, cost-effective, uncomplicated, highly versatile and effective, can be surprisingly and unobviously implemented by adapting known technologies, and are thus readily suited for efficiently and economically manufacturing core and carrierless semiconductor package systems, which are fully compatible with conventional manufacturing methods or processes and technologies.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. An integrated circuit packaging system comprising:
   a base substrate, the base substrate includes:
      a base encapsulation,
      a top trace embedded in the base encapsulation, the top trace coplanar with a top surface of the base encapsulation, and
      a conductive stud on the top trace, the conductive stud embedded in the base encapsulation, the conductive stud coplanar with the top trace;
   a system interconnect in direct contact with the conductive stud and in direct contact with the base encapsulation, a portion of the system interconnect embedded within the base encapsulation;
   an integrated circuit device on the base substrate; and
   a top encapsulation encapsulating the base substrate and the integrated circuit device.

2. The system as claimed in claim 1 wherein the conductive stud includes a bottom recess and a peripheral groove.

3. The system as claimed in claim 1 further comprising a redistribution layer between the base substrate and the integrated circuit device.

4. The system as claimed in claim 1 further comprising a stacked device mounted on the integrated circuit device.

5. The system as claimed in claim 1 further comprising a mold overlap between the base substrate and the top encapsulation.

* * * * *